(12) United States Patent
Adachi et al.

(10) Patent No.: US 9,386,733 B2
(45) Date of Patent: Jul. 5, 2016

(54) BRAID AND WIRE HARNESS

(71) Applicant: YAZAKI CORPORATION, Tokyo (JP)

(72) Inventors: Hideomi Adachi, Kosai (JP); Yoshiaki Ozaki, Kosai (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/224,341

(22) Filed: Mar. 25, 2014

(65) Prior Publication Data

US 2014/0202756 A1 Jul. 24, 2014

Related U.S. Application Data

(63) Continuation of application No. PCT/JP2012/075732, filed on Sep. 27, 2012.

(30) Foreign Application Priority Data

Sep. 27, 2011 (JP) ................................. 2011-210103

(51) Int. Cl.
*H01B 7/00* (2006.01)
*H02G 3/04* (2006.01)
(Continued)

(52) U.S. Cl.
CPC .......... *H05K 9/0007* (2013.01); *B60R 16/0215* (2013.01); *H01B 7/228* (2013.01);
(Continued)

(58) Field of Classification Search
CPC ..... H05K 9/00; H05K 9/0003; H05K 9/0088; H05K 9/009; H05K 9/0007; H01B 7/22; H01B 7/0892; H01B 3/30; H01B 7/228; H01B 11/206; H01B 11/1878; H01B 11/1808; H02G 15/188; H02G 3/0481; H02G 11/00; B60R 16/0215; H01R 13/6599; H01R 13/6585; H01R 2105/00; H01R 2201/26; H01Q 9/16; H01Q 9/30
USPC .... 174/72 A, 377, 102 R, 88 C, 84 R, 105 R, 174/70 R, 74 R
See application file for complete search history.

(56) References Cited

U.S. PATENT DOCUMENTS 4,375,009 A * 2/1983 Fearnside et al. ............... 174/36
5,414,211 A * 5/1995 Chan .............................. 174/36
(Continued)

FOREIGN PATENT DOCUMENTS

GB       724 451 A      2/1955
GB       724451 A   *  2/1955    ............. H01B 7/182
(Continued)

OTHER PUBLICATIONS

Dyeing of Polyester, Aramid and Polypropylene Fibers—2003.*
(Continued)

*Primary Examiner* — Timothy Thompson
*Assistant Examiner* — Guillermo Egoavil
(74) *Attorney, Agent, or Firm* — Sughrue Mion, PLLC

(57) ABSTRACT

A braid having a function as an exterior member as well as an electromagnetic shielding function is provided. Also, a wire harness including such a braid in a configuration is provided. A braid is used for a wire harness cabled to a hybrid vehicle. Also, the braid is formed by knitting multiple ultrathin strands in a tubular shape. The braid includes two kinds of strands, a metal strand made of metal having conductivity and a resin strand made of synthetic resin having abrasion resistance etc., and ensures abrasion resistance and impact resistance by the portion made of the resin strand while performing an electromagnetic shielding function by the portion made of the metal strand.

5 Claims, 3 Drawing Sheets

(51) Int. Cl.
*H05K 9/00* (2006.01)
*H01R 13/6585* (2011.01)
*H01R 13/6599* (2011.01)
*B60R 16/02* (2006.01)
*H01B 7/22* (2006.01)
*H01R 105/00* (2006.01)

(52) U.S. Cl.
CPC ........ *H01R13/6585* (2013.01); *H01R 13/6599* (2013.01); *H01R 2105/00* (2013.01); *H01R 2201/26* (2013.01)

(56) References Cited

U.S. PATENT DOCUMENTS

| | | | | |
|---|---|---|---|---|
| 5,504,274 | A * | 4/1996 | McCabe et al. | 174/36 |
| 5,613,522 | A * | 3/1997 | Ford | D03D 3/02 |
| | | | | 138/103 |
| 5,639,527 | A * | 6/1997 | Hurwitz | 428/36.3 |
| 6,984,783 | B2 | 1/2006 | Kusumi et al. | 174/50 |
| 8,080,734 | B2 * | 12/2011 | Mukai | H01Q 9/30 |
| | | | | 174/102 R |
| 2003/0119351 | A1 | 6/2003 | Miyazaki et al. | |
| 2004/0099427 | A1 | 5/2004 | Kihira et al. | |
| 2004/0235381 | A1 | 11/2004 | Iwasaki et al. | |
| 2008/0190642 | A1 * | 8/2008 | Allen et al. | 174/102 R |
| 2009/0133925 | A1 * | 5/2009 | Albert et al. | 174/72 A |
| 2009/0234190 | A1 * | 9/2009 | Sugisawa | A61B 1/00071 |
| | | | | 600/140 |
| 2010/0319989 | A1 * | 12/2010 | Huang | H02G 3/0481 |
| | | | | 174/70 R |
| 2011/0155458 | A1 * | 6/2011 | Kato | B60R 16/0215 |
| | | | | 174/74 R |

FOREIGN PATENT DOCUMENTS

| | | |
|---|---|---|
| JP | S61-161610 A | 7/1986 |
| JP | 11-250742 A | 9/1999 |
| JP | 2003-197037 A | 7/2003 |
| JP | 2006-031954 A | 2/2006 |
| JP | 2007-280666 A | 10/2007 |
| JP | 2008-181801 A | 8/2008 |
| JP | 2008181801 A * | 8/2008 |
| JP | 2009-140612 A | 6/2009 |
| JP | 2010-140757 A | 6/2010 |
| WO | WO 2011011776 A1 * | 1/2011 |

OTHER PUBLICATIONS

International Search Report dated Jan. 24, 2013 issued in International Application No. PCT/JP2012/075732 (PCT/ISA/210).
Written Opinion dated Jan. 24, 2013 issued in International Application No. PCT/JP2012/075732 (PCT/ISA/237).
"Hybrid & Electric Vehicles", Delfingen Industry, Jun. 25, 2012, 4 pgs. total, XP002689796.
Office Action dated Jun. 3, 2015, issued by the State Intellectual Property Office of P.R. China in counterpart Chinese Application No. 201280047414.9.
Communication from the Japanese Patent Office dated Sep. 15, 2015 in a counterpart Japanese application No. 2011-210103.

* cited by examiner

BRAID AND WIRE HARNESS

CROSS REFERENCE TO RELATED APPLICATIONS

This application is a continuation of PCT application No. PCT/JP2012/075732, which was filed on Sep. 27, 2012 based on Japanese patent application (patent application 2011-210103) filed on Sep. 27, 2011, whose contents are incorporated herein by reference. Also, all the references cited herein are incorporated as a whole.

BACKGROUND OF THE INVENTION

1. Technical Field

The present invention relates to a wire harness cabled to a vehicle, and a braid constructing this wire harness.

2. Background Art

A wire harness disclosed in the following Japanese Patent Publication No. JP-A-2003-197037 is configured to include plural electric wires and a braid with which the plural electric wires are collectively covered. The braid is formed in a tubular shape by using multiple ultrathin metal strands having conductivity and knitting the strands. The braid is provided in order to perform a function of electromagnetic shielding against the plural electric wires.

SUMMARY

As described above, the braid is means for performing the electromagnetic shielding function, and the braid itself does not have sufficient abrasion resistance or impact resistance essentially. Therefore, it is necessary to provide the outside of the braid with an exterior member depending on a cabling position of the wire harness.

Formation of the exterior member leads to an increase in the number of components constructing the wire harness. Also, the weight and cost increase with the increase in the number of components.

The invention has been implemented in view of the circumstances described above, and a problem of the invention is to provide a braid having a function as an exterior member as well as an electromagnetic shielding function. Also, a problem of the invention is to provide a wire harness including such a braid in a configuration.

According to one aspect of the present invention, there is provided a braid for a wire harness cabled to a vehicle, having multiple ultrathin strands knitted in a tubular shape to form the braid, wherein the strands include a metal strand made of metal having conductivity and a resin strand made of synthetic resin having at least abrasion resistance.

According to the invention having such a feature, at least abrasion resistance is ensured by the portion made of the resin strand while performing an electromagnetic shielding function by the portion made of the metal strand. The resin strand may have impact resistance in addition to the abrasion resistance.

The braid may be formed by knitting in a state of a pick which is a bundle of the strands, and the metal strand and the resin strand are mixed inside said pick.

According to the invention having such a feature, the braid is formed by knitting a bundle (pick) in which the metal strand and the resin strand are mixed in a tubular shape. In the braid, the metal strand and the resin strand are mixed inside the pick, so that even when variation (deviation) occurs in the metal strand and the resin strand, the variation is included in variation inside the pick, with the result that the variation can be minimized. According to the invention, the variation in the metal strand or the resin strand from the standpoint of the whole braid has no problem functionally.

The resin strand may be made of a single wire or may be made of plural twisted wires.

According to the invention having such a feature, when the resin strand is made of the single wire, stiffness can be given to the braid. Also, a cross-sectional area of one wire becomes large and abrasion resistance can be improved. On the other hand, when the resin strand is made of the plural twisted wires, one twisted wire becomes thin and flexibility can be given to the braid. Also, the flexibility increases followability of the braid and impact resistance can be improved.

A cross-sectional area of the resin strand may be made larger than a cross-sectional area of the metal strand.

According to the invention having such a feature, a difference is given to the cross-sectional areas of the strands, and the cross-sectional area of the resin strand is made larger. Consequently, the resin strand is subjected to influence of impact or friction (abrasion). That is, the influence of impact or friction (abrasion) on the metal strand is decreased and the electromagnetic shielding function is well maintained.

The resin strand may be colored with an identification color of a high-voltage system.

According to the invention having such a feature, it is identified as the braid used in the high-voltage system at a glance, and it becomes unnecessary to form a separate member for identification in the case of being used in the wire harness.

A wire harness characterized by including a braid as described in any one of above, and including one or plural high-voltage conducting paths covered with the braid According to the invention having such a feature, the wire harness for giving the electromagnetic shielding function and a function of an exterior member to the braid with which one or plural high-voltage conducting paths are covered is obtained, and the need for a dedicated exterior member is eliminated.

According to one aspect of the present invention described above, the strand is configured to include two kinds of strands, a metal strand and a resin strand, so that the invention has an effect capable of providing the braid having a function as an exterior member as well as an electromagnetic shielding function.

According to another aspect of the present invention described above, the metal strand and the resin strand are mixed inside the pick, so that the invention has an effect capable of performing a shielding function without deviation as the whole braid and also functioning as the exterior member. The invention has an effect capable of providing the better braid.

According to still another aspect of the present invention described above, the resin strand is made of the single wire or the plural twisted wires, so that the invention has an effect capable of giving stiffness or flexibility to the braid. Also, the invention has an effect capable of improving abrasion resistance or impact resistance. The invention has an effect capable of obtaining the braid with specifications according to purposes.

According to still another aspect of the present invention described above, a difference is given to the cross-sectional areas of the strands, so that the invention has an effect capable of decreasing influence of impact or friction (abrasion) on the metal strand. The invention has an effect capable of maintaining the electromagnetic shielding function even in the case of exerting the influence on the braid.

According to still another aspect of the present invention described above, the resin strand is colored with the identification color of the high-voltage system, so that the invention has an effect capable of being identified as the braid used in the high-voltage system at a glance without forming a separate member for identification.

According to still another aspect of the present invention described above, the electromagnetic shielding function and the function of the exterior member are given to the braid with which one or plural high-voltage conducting paths are covered, so that the invention has an effect capable of reducing the number of components of the wire harness. Consequently, the invention also has an effect capable of reducing the weight and cost of the wire harness.

BRIEF DESCRIPTION OF THE DRAWINGS

FIG. 1A is a schematic diagram of a vehicle showing a cabling state of the wire harness, and FIG. 1B is a diagram showing a configuration of the braid and the wire harness.

FIG. 2A is an enlarged perspective view of the distal end, and FIG. 2B is sectional views of a metal strand and a resin strand, and FIG. 2C is a sectional view of the resin strand made of a single wire or twisted wires.

DETAILED DESCRIPTION OF EMBODIMENTS

A braid with which one or plural high-voltage conducting paths are covered has a function as an exterior member as well as an electromagnetic shielding function. In order to have the electromagnetic shielding function and the function of the exterior member, the braid includes the following two kinds as strands constructing this braid. That is, two kinds of a metal strand made of metal having conductivity and a resin strand made of synthetic resin having at least abrasion resistance are included.

Figure 1A:
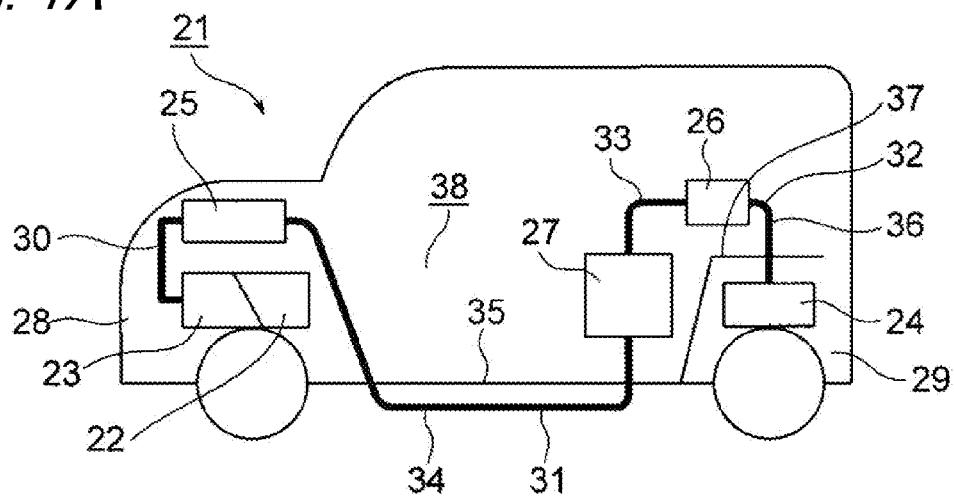
FIGS. 1A and 1B are diagrams showing a braid and a wire harness of the invention.
Figure 1B:
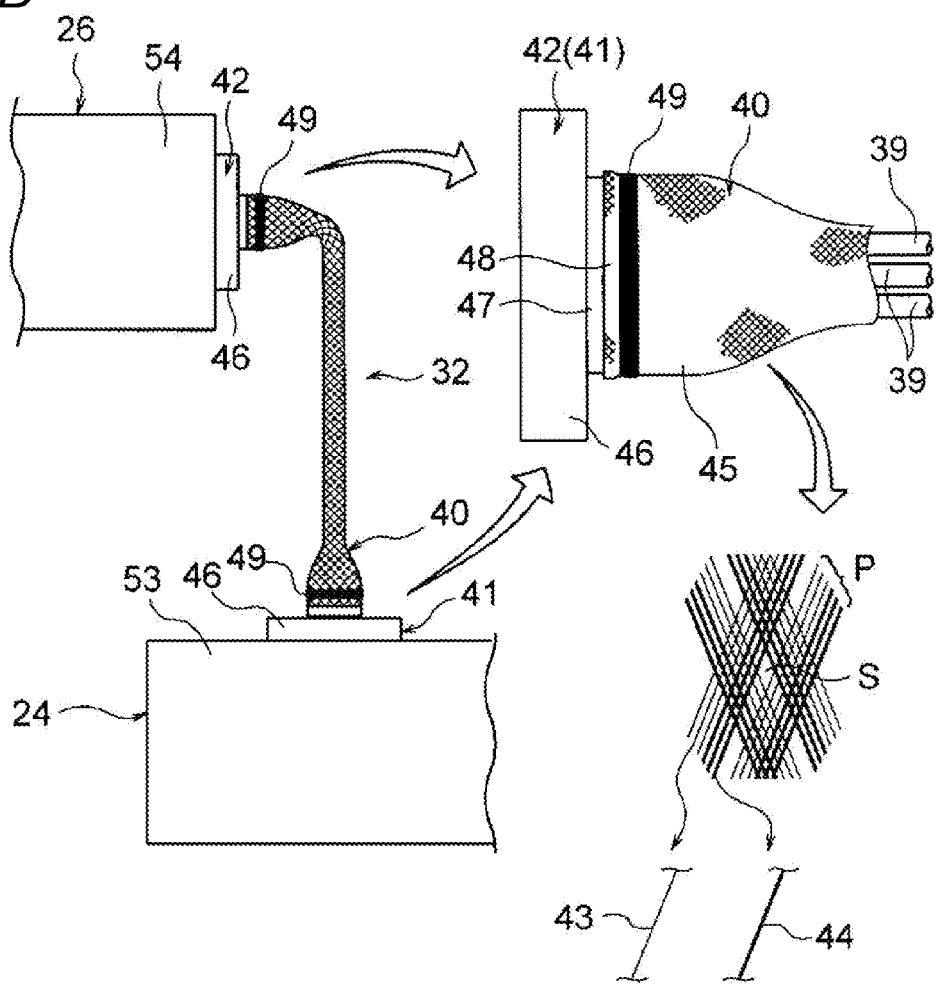

An embodiment will hereinafter be described with reference to the drawings. FIGS. 1A and 1B are diagrams showing a braid and a wire harness of the invention. Also, FIGS. 2A to 2C and FIG. 3 are diagrams showing the distal ends of the wire harnesses and the braids.

In the present embodiment, an example of adopting the wire harness and a shielding structure of the invention in a hybrid vehicle (or may be an electric vehicle) shall be given and described.

In FIG. 1A, reference numeral 21 shows a hybrid vehicle. The hybrid vehicle 21 is a vehicle driven with a combination of an engine 22, a front motor unit 23 and a rear motor unit 24, and is constructed so that electric power from a battery 27 (a battery pack, an assembled battery) is supplied to the front motor unit 23 through a front inverter unit 25 and to the rear motor unit 24 through a rear inverter unit 26. The engine 22, the front motor unit 23 and the front inverter unit 25 are installed in an engine room 28 of a position having front wheels etc. in the embodiment. Also, the rear motor unit 24, the rear inverter unit 26 and the battery 27 are installed in a vehicle rear part 29 having rear wheels etc. (The installation position is shown as one example. In addition, the battery 27 is not particularly limited as long as the battery 27 can be used in the hybrid vehicle 21, the electric vehicle, etc.)

The front motor unit 23 is connected to the front inverter unit 25 by a high-voltage wire harness 30. Also, the front inverter unit 25 is connected to the battery 27 by a high-voltage wire harness 31. Further, the rear motor unit 24 is connected to the rear inverter unit 26 by a high-voltage wire harness 32. Furthermore, the rear inverter unit 26 is connected to the battery 27 by a high-voltage wire harness 33.

An intermediate part 34 of the wire harness 31 is cabled to the ground side of a vehicle body underfloor part 35. The wire harness 31 is cabled in substantially parallel along the vehicle body underfloor part 35. The vehicle body underfloor part 35 is a publicly known body and also is the so-called panel member, and a through hole (numeral is omitted) is formed in a predetermined position. This through hole forms the insertion portion of the wire harness 31.

An intermediate part 36 of the wire harness 32 is cabled so as to extend through a vehicle body underfloor part 37 in the vehicle rear part 29. A through hole into which the wire harness 32 is inserted is formed like the through hole of the wire harness 31. Reference numeral 38 shows a room inside.

In addition, the wire harness 30 is connected to the front motor unit 23 and also the wire harness 32 is connected to the rear motor unit 24, so that the wire harness may also be called a motor cable or a motor cable device.

The invention will hereinafter be described by taking the wire harness 32 as an example. The invention can be applied to the wire harnesses 30, 31, 33 as well as the wire harness 32.

In FIG. 1B, the wire harness 32 is configured to include three high-voltage electric wires 39 (conducting paths), a braid 40 with which the three high-voltage electric wires 39 are collectively covered, the braid 40 for shielding the high-voltage electric wires 39, a motor side connection 41 formed on one end side of the three high-voltage electric wires 39, and an inverter side connection 42 formed on the other end side. The wire harness 32 has a configuration without an exterior member unlike a conventional wire harness. This is because the braid 40 is allowed to function as the exterior member by giving abrasion resistance or impact resistance to the braid 40 (the details will be described below).

Figure 2A:
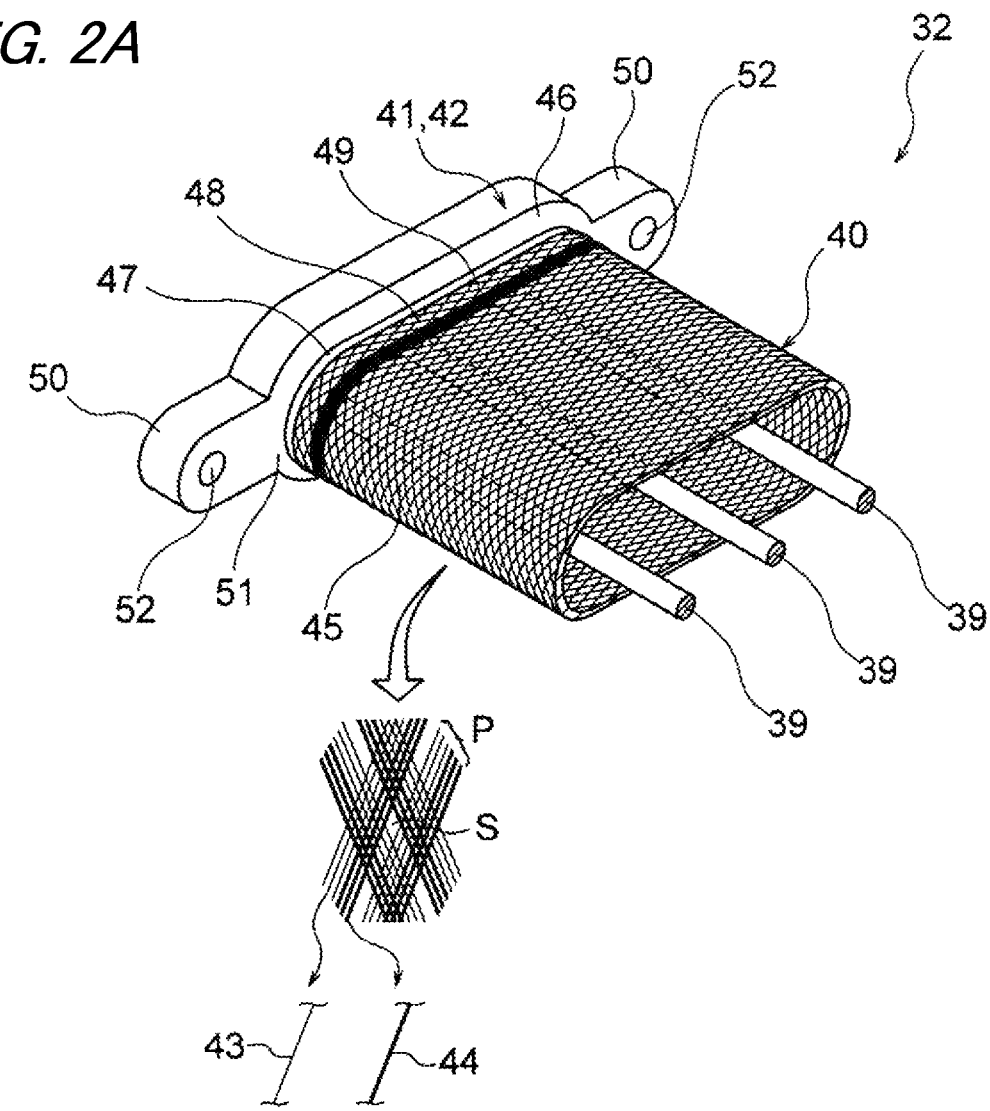
FIGS. 2A to 2C are diagrams showing a distal end of the wire harness and the braid.

In FIGS. 1B and 2A, the high-voltage electric wire 39 is a high-voltage conducting path including a conductor and an insulator (coating), and is formed so as to have a length necessary for electrical connection. The conductor is made of copper or copper alloy, or aluminum or aluminum alloy. The conductor has a conductor structure formed by twisting strands or a bar-shaped conductor structure with a rectangular or circular cross section (for example, a conductor structure with a rectangular or circular single core and in this case, the electric wire itself also has a bar shape), and may have any of the conductor structures.

In addition, the embodiment uses the high-voltage electric wire 39, but is not limited to this high-voltage electric wire 39. That is, for example, a high-voltage conducting path formed by providing a publicly known bus bar with an insulator may be used.

The braid 40 is a tubular member for electromagnetic shielding (a braid shielding member for measures against electromagnetic waves), and is formed in the shape in which the three high-voltage electric wires 39 can be covered over the whole length in the embodiment. The braid 40 is provided in order to perform a function of electromagnetic shielding against the three high-voltage electric wires 39. In the braid 40, a part of the strands constructing this braid 40 has abrasion resistance or impact resistance. Then, the braid 40 also has a function as the exterior member by the characteristics. The braid 40 will hereinafter be described in a little more detail.

The braid 40 is formed by knitting multiple ultrathin strands in a tubular shape. Concretely, when a bundle of plural strands is called a pick P, the braid 40 is formed by knitting plural picks P so as to be circumferentially arranged and also intersect mutually. In the embodiment, the braid 40 is knitted and formed so that a stitch S formed by the mutually intersecting picks P becomes small.

As the strand in the braid 40, two kinds of strands, a metal strand 43 made of metal having conductivity and a resin strand 44 made of synthetic resin having abrasion resistance and impact resistance, are used. These two kinds of a metal strand 43 and a resin strand 44 are used so as to be mixed inside the picks P by plural strands. In the embodiment, a metal fiber which is an annealed copper wire is used as the metal strand 43. Also, a resin fiber made of a PET resin is used as the resin strand 44 (material is shown as one example).

Figure 2B:
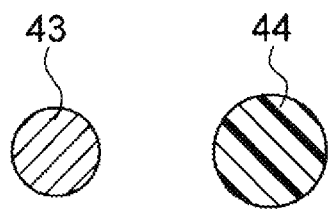

The resin strand 44 is formed so that the cross-sectional area of the resin strand 44 becomes larger than that of the metal strand 43 (see FIG. 2B). That is, the resin strand 44 is formed so as to become thicker than the metal strand 43. (This is one example and the same thickness may be used. In addition, thickening the resin strand 44 is effective in obtaining the effect described below.)

Figure 2C:
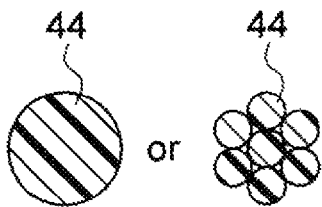

A single wire with a circular cross section is used in the metal strand 43. On the other hand, plural twisted wires or a single wire with a circular cross section is used in the resin strand 44 as shown in FIG. 2C. In the resin strand 44, the plural twisted wires or the single wire is selected for any purpose.

The resin strand 44 is colored with an identification color of a high-voltage system (one example). Concretely, the resin strand 44 is colored with an orange color using a pellet. This is because the wire harness 32 is the high-voltage electric wires. In addition, identification includes a method for partially winding an orange tape on the outer periphery of the braid 40. The tape winding is inexpensive.

Figure 3:
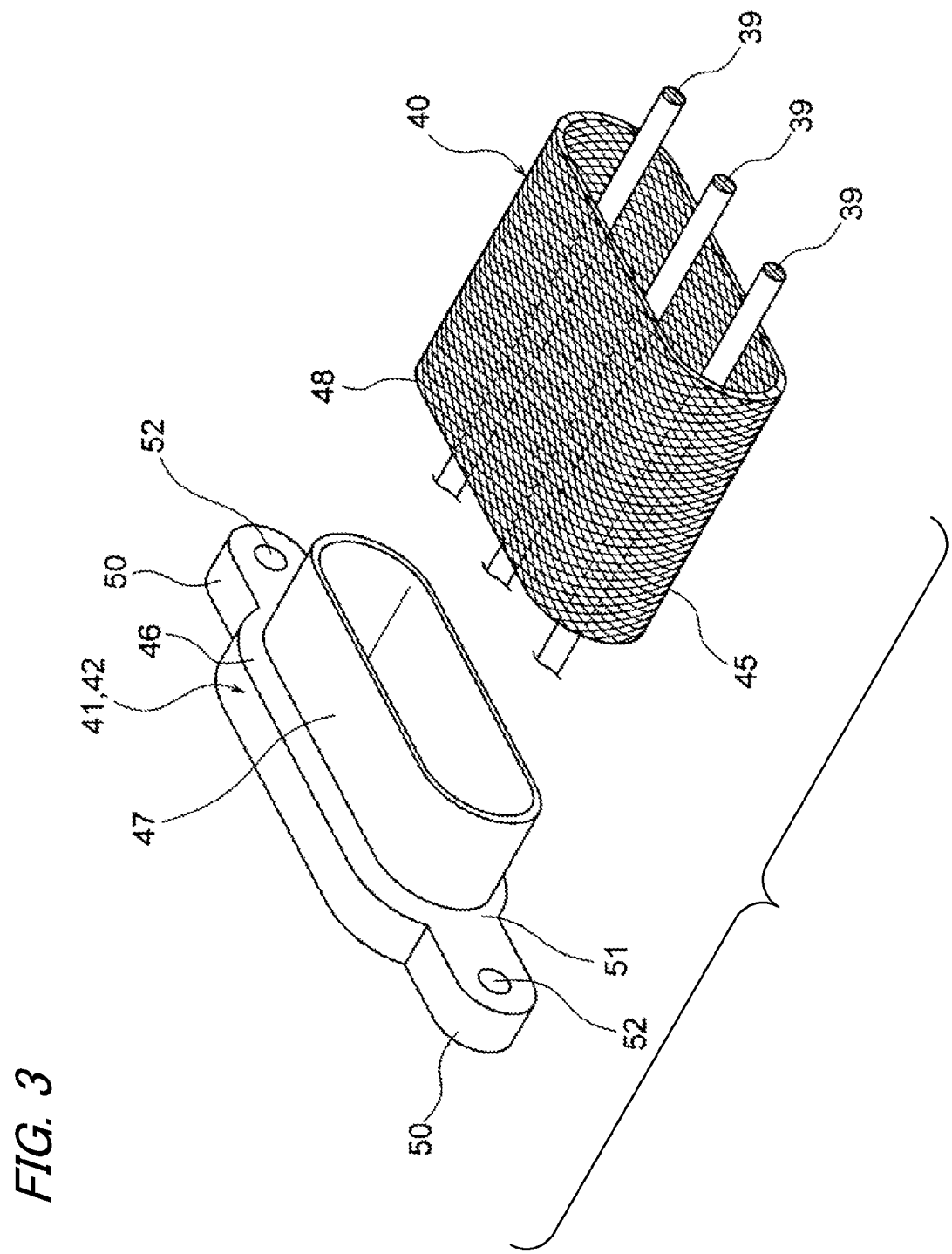
FIG. 3 is an exploded perspective view of the distal end of the wire harness and the braid.

The distal ends 45 which are one end and the other end of the braid 40 as described above are fixed to metal shells 46 of the motor side connection 41 and the inverter side connection 42 by a proper method. In the embodiment, the braid 40 is fixed by welding. Concretely, the braid 40 is fixed by inserting an end 48 of the braid 40 into the outside of a body tubular part 47 of the metal shell 46 and then welding the periphery of the end 48 to an outer surface of the body tubular part 47 after this insertion as shown in FIG. 3. Reference numeral 49 of FIGS. 1B and 2A shows a weld part. The weld part 49 is formed so as to make one round of the outer surface of the body tubular part 47.

In addition, welding may be carried out partially in a circumferential direction without being limited to the one round. Also, a weld part is not limited to the outer surface of the body tubular part 47, and may be a plane part 51 of a fixing part 50 (see FIG. 3). The planar portion located between the proximal end of the body tubular part 47 and through holes 52 of the fixing part 50 corresponds to the plane part 51.

In addition to the welding described above, a fixing method by insert molding, a fixing method by crimping using a publicly known shield ring, etc. are given.

The metal shell 46 is formed as a metallic component having conductivity. The metal shell 46 is constructed so that the braid 40 can be electrically connected when the metal shell 46 is fixed (bolted) to shield cases 53 and 54.

As described above with reference to FIGS. 1A to 3, the braid 40 according to the invention is used for the wire harness 32 cabled to the hybrid vehicle 21. Also, the braid 40 is formed by knitting multiple ultrathin strands in a tubular shape. The braid 40 includes two kinds of strands, a metal strand 43 made of metal having conductivity and a resin strand 44 made of synthetic resin having abrasion resistance etc., and ensures abrasion resistance and impact resistance by the portion made of the resin strand 44 while performing an electromagnetic shielding function by the portion made of the metal strand 43. Therefore, the braid 40 according to the invention has an effect of having a function as an exterior member as well as the electromagnetic shielding function unlike a conventional example.

Also, the braid 40 according to the invention is formed by knitting in a state of the pick P which is a bundle of the strands, and the metal strand 43 and the resin strand 44 are mixed inside this pick P, so that even when variation (deviation) occurs in the metal strand 43 and the resin strand 44, the variation can be absorbed as variation inside the pick P. That is, the variation can be minimized. Since the braid 40 does not hinder the function due to the variation in the metal strand 43 or the resin strand 44 from the standpoint of the whole braid 40, there is an effect capable of providing the better braid 40.

Also, when the resin strand 44 is made of a single wire, the braid 40 according to the invention has an effect capable of giving stiffness to the braid 40, or an effect capable of improving abrasion resistance since a cross-sectional area of one wire becomes large. On the other hand, when the resin strand 44 is made of plural twisted wires, one twisted wire becomes thin, with the result that the braid 40 has an effect capable of giving flexibility to the braid 40, or an effect capable of improving impact resistance by increasing followability of the braid 40 by this flexibility. Moreover, the braid 40 according to the invention has an effect capable of meeting specifications according to purposes by making the resin strand 44 of the single wire or the plural twisted wires.

Also, since a cross-sectional area of the resin strand 44 is made larger than a cross-sectional area of the metal strand 43, the braid 40 according to the invention has an effect capable of subjecting the resin strand 44 to influence of impact or friction (abrasion). That is, the influence of impact or friction (abrasion) on the metal strand 43 is decreased, with the result that the braid 40 has an effect capable of well maintaining the electromagnetic shielding function.

Also, since the resin strand 44 is colored with an identification color (orange color) of a high-voltage system, the braid 40 according to the invention has an effect capable of being identified as the braid 40 or the wire harness 32 used in the high-voltage system at a glance without forming a separate member for identification.

Moreover, since the electromagnetic shielding function and the function of the exterior member are given to the braid 40 with which the plural high-voltage electric wires 39 are covered, the wire harness 32 according to the invention has an effect capable of reducing the number of components as the wire harness 32 and also an effect capable of reducing the weight and cost.

It is apparent that various modifications can be made in the invention within a scope not deviating from the gist of the invention.

INDUSTRIAL APPLICABILITY

The present invention is useful for providing a wire harness for giving the electromagnetic shielding function and a function of an exterior member to the braid with which one or plural high-voltage conducting paths are covered is obtained, and the need for a dedicated exterior member is eliminated.

What is claimed is:
1. A braid for a wire harness, the braid comprising multiple strands knitted in a tubular shape,
wherein the strands comprise a metal strand made of metal having electrical conductivity and a resin strand made of synthetic resin having at least abrasion resistance, and wherein the braid is formed by knitting together a plurality of picks in which each said pick is a bundle of the strands, and the metal strand and the resin strand are mixed inside of each said pick, wherein a cross-sectional area of the resin strand is larger than a cross-sectional area of the metal strand.

2. A braid as claimed in claim 1, wherein the resin strand comprises plural twisted wires.

3. A braid as claimed in claim 1, wherein the resin strand is colored with an identification color.

4. A wire harness comprising a braid as claimed in claim 1, and including one or plural conducting paths covered with the braid.

5. A braid as claimed in claim 1, wherein the resin strand comprises a single wire.

\* \* \* \* \*